US009096090B2

(12) United States Patent
Vest

(10) Patent No.: US 9,096,090 B2
(45) Date of Patent: Aug. 4, 2015

(54) LIQUID PLATEMAKING WITH LASER ENGRAVING

(76) Inventor: Ryan W. Vest, Cumming, GA (US)

( * ) Notice: Subject to any disclaimer, the term of this patent is extended or adjusted under 35 U.S.C. 154(b) by 469 days.

(21) Appl. No.: 13/467,325

(22) Filed: May 9, 2012

(65) Prior Publication Data

US 2013/0299471 A1   Nov. 14, 2013

(51) Int. Cl.
| | | |
|---|---|---|
| *B23K 26/00* | (2014.01) | |
| *B41N 1/12* | (2006.01) | |
| *B41C 1/05* | (2006.01) | |

(52) U.S. Cl.
CPC .... *B41N 1/12* (2013.01); *B41C 1/05* (2013.01)

(58) Field of Classification Search
CPC ............ B41L 4/00; B23K 15/00; B41B 1/02; B41F 7/00; B41F 23/04; C23F 1/00
USPC ........ 219/121.16, 121.18, 121.19; 101/401.1, 101/401.4, 425, 452, 457, 467, 470, 471, 101/483, 487; 216/65, 94
See application file for complete search history.

(56) References Cited

U.S. PATENT DOCUMENTS

| | | | |
|---|---|---|---|
| 2,760,863 A * | 8/1956 | Plambeck, Jr. ................ 430/306 |
| 3,742,853 A | 7/1973 | Landsman | |
| 3,794,494 A | 2/1974 | Kai et al. | |
| 3,848,998 A | 11/1974 | Yonekura et al. | |
| 3,960,572 A | 6/1976 | Ibata et al. | |
| 4,046,071 A * | 9/1977 | Mizuno et al. ................ 101/395 |
| 4,214,942 A | 7/1980 | Inoko et al. | |
| 4,442,302 A | 4/1984 | Pohl | |
| 5,213,949 A | 5/1993 | Kojima et al. | |
| 5,259,311 A * | 11/1993 | McCaughey, Jr. ......... 101/401.1 |
| 5,348,605 A | 9/1994 | Hughes et al. | |
| 5,587,261 A * | 12/1996 | Audett et al. .................... 430/18 |
| 5,813,342 A | 9/1998 | Strong | |
| 6,776,095 B2 * | 8/2004 | Telser et al. ................. 101/401.1 |
| 7,237,482 B2 * | 7/2007 | Vest et al. ................... 101/401.1 |
| 7,811,744 B2 | 10/2010 | Figov | |
| 2002/0108519 A1 * | 8/2002 | Friedman ....................... 101/467 |
| 2004/0157162 A1 * | 8/2004 | Yokota et al. .................. 430/306 |
| 2004/0259022 A1 | 12/2004 | Hiller et al. | |
| 2006/0112844 A1 | 6/2006 | Hiller et al. | |
| 2008/0076061 A1 | 3/2008 | Figov | |
| 2008/0107908 A1 | 5/2008 | Long et al. | |
| 2010/0009285 A1 | 1/2010 | Daems et al. | |
| 2010/0141969 A1 | 6/2010 | Brazier et al. | |
| 2010/0242761 A1 * | 9/2010 | Hackler et al. ............. 101/401.1 |
| 2011/0300398 A1 | 12/2011 | Vest et al. | |
| 2012/0082932 A1 * | 4/2012 | Battisti et al. ............... 430/270.1 |

* cited by examiner

*Primary Examiner* — Dana Ross
*Assistant Examiner* — Michael LaFlame, Jr.
(74) *Attorney, Agent, or Firm* — Carmody Torrance Sandak & Hennessey LLP

(57) ABSTRACT

A method of making a relief image printing element from a liquid photopolymer composition is described. The method includes the steps of (1) casting a liquid photopolymer layer onto a cover sheet and at least substantially simultaneously placing a hacking sheet onto the liquid photopolymer layer; (2) preliminarily exposing the liquid photopolymer layer to actinic radiation to create at least one island of solid photopolymer in the liquid photopolymer layer where it is desirable to laser engrave a relief image; (3) reclaiming uncured liquid photopolymer from the relief image printing element; (4) processing the at least one island of solid photopolymer to remove uncured liquid photopolymer; (5) exposing the at least one island of solid photopolymer to actinic radiation to fully cure the islands of solid photopolymer; and (6) laser engraving the at least one island of solid photopolymer to produce the relief image therein.

11 Claims, No Drawings

LIQUID PLATEMAKING WITH LASER ENGRAVING

FIELD OF THE INVENTION

The present invention relates generally to methods of laser engraving printing elements made from liquid photopolymers.

BACKGROUND OF THE INVENTION

Photopolymerizable and/or photocurable and/or radiation curable resins can be selectively cross-linked and cured to create relief images during the production of relief image printing plates.

A common approach utilizes a photopolymerizable (also known as a photosensitive, photoimageable, photopolymer, photohardenable or photocurable) resin composition. While many different photopolymerizable resin compositions are known, they share the quality that upon exposure to certain wavelengths of light, the resin reacts with itself to form a structure that is insoluble in ink. Thus, photopolymerizable resin compositions may be used to form a hard, ink-insoluble, raised surface (i.e., relief image) for photopolymer plates.

Photopolymerizable resins can be processed in a variety of ways. For example, they can be processed as solid plates made of a cast photopolymerizable resin. They can also be processed by first forming a layer of a liquid photopolymerizable resin and then exposing the formed resin layer to actinic radiation followed by developing to remove uncured portions of the photopolymerizable resin layer. Liquid photopolymerizable resins provide an advantage over solid sheet polymers because the uncured resin can be reclaimed from the non-image areas for later reuse. Liquid photopolymerizable resins have a further advantage as compared to sheet polymers in terms of flexibility, enabling the production of images of widely varying thicknesses simply by changing the machine settings.

In the platemaking process, the front surface of the printing plate is exposed to ultraviolet light through a photographic negative to selectively crosslink and cure portions of the printing plate that are not covered by the photographic negative. Alternative, an in situ negative may be prepared by laser ablating a mask layer to create the in situ negative therein. Thereafter, those portions of the plate that remain uncured (i.e., portions covered by the negative) are removed in a development process, thereby revealing the relief image in the plate surface. The development step may comprise contacting the printing element with a suitable developing solution. In the alternative, the image may be developed using heat plus blotting.

Another approach to platemaking utilizes a direct laser engraving process, in which the printing relief is engraved directly into the relief-forming layer of the printing element by means of a laser. The term "laser-engravable" is defined as a relief layer that has the property of absorbing laser radiation so that it is removed or at least detached in those parts where it is exposed to a laser beam of sufficient intensity. The entire upper surface of the photopolymer printing plate is first exposed to ultraviolet light for a predetermined period in order to provide the entire surface with a cured layer of material. Thereafter, the cured layer of material can be laser engraved, which is most often accomplished using an IR laser. Preferably, the laser engravable layer is vaporized or decomposed thermally or by oxidation without melting beforehand, so that its decomposition products are removed from the layer in the form of hot gases, vapors, fumes or small particles.

While direct laser engraving has been used for a number of years, this technique has acquired broader commercial interest only in recent years with the advent of improved laser systems. These improvements in the laser system include better focusability of the laser beam, higher power and computer controlled, beam guidance. Direct laser engraving has several notable advantages over conventional processes of producing relief image print plates. For example, a number of time-consuming process steps, such as the creation of a photographic negative and development and drying of the printing plate can be disposed of. Furthermore, the side wall shape of the individual relief elements can be individually designed.

In the laser engraving step, the laser engraver control unit is supplied with input data through artwork which is scanned as the photopolymer plate is engraved, or alternately, supplied with a digitized representation of the engraving directly from a separate computer system wherein the artwork is provided utilizing computer aided design (CAD) software, digitization of photographic or drafted artwork, or a combination thereof.

However, there are also several noted disadvantages to the laser engraving process. Firstly, flexographic printing elements have a strong tendency to form melt edges around the engraved elements during laser engraving. At the edge of the engraved elements, the laser melts but is no longer decomposed (or is no longer completely decomposed). Such melt edges lead to ill-defined printing and generally cannot be removed, even by subsequent washing. Undesired melting of the layer also leads to unsatisfactory resolution. In addition, the degradation products which form in the course of the laser engraving frequently present problems. The nongaseous fractions of the decomposition products formed in the course of laser engraving are, as a rule, extremely tacky and may be completely or partly deposited again on the surface of the printing relief. Finally, even with the advent of improved laser systems, the laser engraving step can be extremely time consuming.

The residue produced by the laser ablation step can be removed by immersing the engraved photopolymer printing plate in a solvent solution for a predetermined time period and at a predetermined, temperature. The residue particulates which form on the plate, and particularly on the edges surrounding the laser ablated areas, are readily removed in a solvent wash step. This step can be accomplished without causing removal of the photopolymer material which defines the printable pattern, since the engraving is performed on fully cured material which is not soluble in the solution. The engraved plate is immersed in the solvent solution to remove the tackiness from the residue, thereby providing sharp edges at the perimeter of the ablated areas, as the particulates are easily removed by brushing when they are no longer self adhering. Following the washout step to remove the residue, the engraved plate is dried at a predetermined temperature for a time period sufficient to drive off any absorbed solvent.

Following the removal of the uncured residue the engraved plate then goes through a finishing step in which surface tack is removed from the engraved plate and the surface is hardened. There are typically two ways in which such surface tack can be removed and the surface hardened. One method is exposure of the front surface of the engraved printing plate to high energy ultraviolet light for a predetermined period of time. The other method is a chemical finishing method wherein the engraved plate is immersed in a solution containing chlorine, bromine or iodine. The finished plate is then ready for mounting on a printing press.

Liquid photopolymer plates are used in a wide array of printing applications and have a wide range of resolution capabilities and plate durometers. Liquid photopolymer plates have long been popular in post print corrugated operations and are also widely used in multi-wall bag and folding carton printing applications.

Typical steps in the liquid photopolymer platemaking process are as follows:

1) Casting of the plate;
2) UV exposure;
3) Reclamation of unexposed photopolymer;
4) Washout and rinsing;
5) Post exposure and rinse;
6) Drying; and
7) Detack exposure.

The overall liquid plate production sequence begins in a casting and exposure unit by placing an image-bearing transparency or negative, i.e., a transparent film having opaque regions corresponding to the reverse of the image which one desires to impart to a printing plate, onto a casting surface, which is typically a glass platen. A thin, transparent polymeric coverfilm is placed over the image-bearing transparency. The image-bearing transparency and coverfilm are secured by vacuum to the platen so that air is displaced and bubbles are not created in the liquid photopolymerizable layer. A liquid photopolymerizable resin is then released from a resin reservoir and is cast onto the cover film with the aid of a leveling blade. Substantially simultaneously with casting the liquid photopolymerizable resin, a substrate, such as a polymeric film, is placed on the layer of photopolymerizable resin, which becomes the finished plate backing. The resulting "sandwich" is then given a UV exposure from at least the top to form relief image in the photopolymer.

A second source of actinic radiation may be positioned above the substrate. In this instance, a glass platen is positioned between the substrate and the second source of actinic radiation to provide a means for controlling thickness uniformity of the layer of photopolymerizable resin by lowering the glass platen, prior to exposure, to rest on shims and make contact with the substrate.

The liquid photopolymerizable resin is exposed to actinic radiation to crosslink and cure the photopolymerizable resin and produce the relief image printing plate or other relief image product. The exposure can be a blanket exposure, in which the entire surface is exposed to actinic radiation (i.e., to create the floor layer) or may be an imagewise exposure in which the photopolymerizable floor layer is exposed through a film negative or other photomask.

The photopolymerizable resin is imaged by exposing the cast photopolymerizable resin to actinic radiation through the film negative or other photomask to selectively crosslink and cure the photopolymerizable resin. The image is typically exposed from at least one side of the plate, preferably the front side, and in some instances may be imaged from both the top and bottom as discussed above. Actinic light, such as UV light, is directed against the photopolymerizable resin layer through the film negative or other photomask. The result is that the liquid photopolymerizable resin is selectively crosslinked and cured to form a printing image surface that mirrors the image on the negative. Upon exposure to actinic radiation, the liquid photopolymerizable resin polymerizes and changes from a liquid state to a solid state to form the raised relief image.

The regions of the resin layer which were protected from actinic radiation by the opaque regions of the transparency are then washed away using a developer solution. The cured regions are insoluble in the developer solution, and so, after development a relief image formed of cured photopolymerizable resin is obtained. The cured resin is likewise insoluble in certain inks, and thus may be used in flexographic printing as described above. U.S. Pat. No. 2,760,863 to Plambeck, the subject matter of which is herein incorporated by reference in its entirety, describes another typical process for preparing a printing plate using photopolymerizable resin, wherein the image-bearing transparency is placed above the photopolymerizable layer, rather than underneath the coverfilm.

A common variation on the above-described process is to expose a liquid photopolymerizable resin to actinic radiation from two sides of the resin layer. See, for example, U.S. Pat. No. 3,848,998 to Yonekura et al. The recognized advantages of exposing from the back (through a backing sheet) as well as the front (through an image-bearing transparency) include better adhesion of the photopolymerizable composition to the backing sheet, better relief image formation, and overcoming the inhibition to polymerization of photopolymerizable resin that is exposed to oxygen with increased control over the relief image height.

In all areas not exposed to UV radiation, the photopolymerizable resin remains liquid after exposure and can be recovered and reclaimed. In a typical process, the uncured photopolymerizable resin is physically removed from the plate in a further process step such that it can be reused to make further plates. The reclamation is typically accomplished by either a large planar squeegee device or an air knife that impinges the plate surface. This reclamation step has the dual benefits of allowing high mass yields (i.e., a very high percentage of the photopolymer becomes usable plate) and at the same time reducing the amount of waste that is generated by the process overall.

Any residual traces of liquid photopolymerizable resin remaining are then removed by nozzle washing or brush washing using a wash-out solution to obtain a washed-out plate, leaving behind the cured relief image. This reclamation technique not only saves material costs of the photopolymerizable resin but also reduces the use and cost of developing chemistry and makes a lighter relief image plate that is safer and easier to handle.

Residual traces of liquid photopolymerizable resin remaining in the regions of the photopolymerizable resin which were protected from the actinic radiation by the opaque regions of the image or film negative can then be washed away using a developer solution or by other development means as is known in the art. The cured regions are insoluble in the developer solution. Thereafter, the cured printing plate may be subjected to various post exposure steps. For example, the plate may be completely immersed in water and exposed to actinic radiation such as UV light emitted from a light source to perform a complete curing of the entire plate and to increase plate strength. After development, a relief image formed of cured photopolymerizable resin is obtained. Finally, the plate may be subjected to a further detack exposure step.

Liquid platemaking processes are also described, for example in U.S. Pat. No. 5,213,949 to Kojima et al., U.S. Pat. No. 5,813,342 to Strong et al. and U.S. Patent Publication No. 2008/0107908 to Long et al., the subject matter of each of which is herein incorporated by reference in its entirety.

One of the primary benefits of liquid platemaking is the ability of reclaiming uncured resin from the non-image areas for later reuse. However, when a liquid photopolymer plate is used for laser engraving, the entire upper surface of the liquid photopolymer printing plate is crosslinked and cured by exposure to actinic radiation (e.g., UV light) prior to the engraving step, and thus the ability to reclaim uncured photopolymer is lost. It would be desirable to provide an improved method of laser engraving liquid photopolymer printing elements that would allow uncured liquid photopolymer to be reclaimed.

SUMMARY OF THE INVENTION

It is an object of the present invention to provide a method of laser engraving liquid photopolymer printing elements.

It is another object of the present invention to provide a method of laser engraving liquid photopolymer printing elements that allows uncured photopolymer to be reclaimed.

It is another object of the present invention to provide a method of laser engraving liquid photopolymer printing elements that can be accomplished more quickly.

To that end, in one embodiment, the present invention relates generally to a method of making a relief image printing element from a liquid photopolymer composition, the method comprising the steps of:

a) casting a liquid photopolymer layer onto a cover sheet and at least substantially simultaneously placing a backing sheet onto the liquid photopolymer layer;

b) preliminarily exposing the liquid photopolymer layer to actinic radiation to create at least one island of solid photopolymer in the liquid photopolymer layer where it is desirable to laser engrave a relief image;

c) reclaiming uncured liquid photopolymer from the relief image printing element;

d) processing the at least one island of solid photopolymer to remove uncured liquid photopolymer;

e) exposing the at least one island of solid photopolymer to actinic radiation to fully cure the at least one island of solid photopolymer; and f) laser engraving the at least one island of solid photopolymer to produce the relief image therein.

DETAILED DESCRIPTION OF THE PREFERRED EMBODIMENTS

The present invention relates generally to a method of making a relief image printing element from a liquid photopolymer composition, the method comprising the steps of:

a) casting a liquid photopolymer layer onto a cover sheet and at least substantially simultaneously placing a backing sheet onto the liquid photopolymer layer;

b) preliminarily exposing the liquid photopolymer layer to actinic radiation to create at least one island of solid photopolymer in the liquid photopolymer layer where it is desirable to laser engrave a relief image;

c) reclaiming uncured liquid photopolymer from the relief image printing element, d) processing the at least one island of solid photopolymer to remove uncured liquid photopolymer;

e) exposing the at least one island of solid photopolymer to actinic radiation to fully cure the at least one island of solid photopolymer; and f) laser engraving the at least one island of solid photopolymer to produce the relief image therein.

As described herein, as is typically done in liquid platemaking processes, a liquid photopolymerizable resin is cast on top of a coverfilm on an exposure glass.

Any liquid photopolymerizable resin that is a fluid when uncured and that hardens upon exposure to selective wavelengths of actinic radiation may be used in the practice of the present invention. Such photopolymerizable resins are very commonly used in the photopolymer printing plate making industry, and thus are well known to those skilled in that art.

One or more different photopolymerizable resins may be employed. Examples of liquid curable photopolymerizable resins include those described above and in U.S. Pat. No. 3,794,494 to Kai et al., U.S. Pat. No. 3,960,572 to Ibata et al. and U.S. Pat. No. 4,442,302 to Pohl, the subject matter of each of which is herein incorporated by reference in its entirety.

Preferably, the coverfilm that is placed on the exposure glass is either a biaxially oriented polypropylene (BOPP) film, a polyester film, or a polyethylene terephthalate (PET) film and is preferably transparent to actinic radiation. To aid in removal from the photopolymer, the coverfilm may be treated with a release agent such as a silicone release agent or other release agent known in the art. Also, in a preferred embodiment, a vacuum is drawn on the coverfilm in order to remove creases and hold it in place on the exposure glass.

Substantially simultaneously with casting the photopolymerizable resin layer, a substrate or backing sheet is laminated on the photopolymerizable resin layer. The backing sheet may preferably comprise a material selected from the group consisting of polyester films, acrylic films, acrylonitrile-butadiene-styrene resins, phenolic resins, and combinations of one or more of the foregoing, given by way of example rather than limitation. The backing sheet should be transparent or at least translucent to actinic radiation. In addition, if desired, the substrate may be treated with a release layer as discussed above. If the substrate material diffracts the exposure radiation, collimated light may be used to overcome the diffraction.

After the liquid photopolymer layer is sandwiched between the coversheet and backing layer, the liquid photopolymer layer is preliminarily exposed to actinic radiation to create at least one island of solid photopolymer in the liquid photopolymer layer where it is desirable to laser engrave a relief image. This preliminary exposure to actinic radiation is performed at a selected intensity and for a predetermined period of time in areas of the printing element where it is desirable to create a relief image by laser engraving. At this point, what is necessary is that the liquid photopolymer layer is selectively cured to create the at least one island of photopolymer that is sufficiently cured to withstand subsequent processing steps. However, it is contemplated that a plurality of islands of solid polymer will be created by the preliminary exposure to actinic radiation, such that the photopolymer printing plate is grossly "imaged" in those areas of the plate that are to contain the laser engraved relief image.

In addition, if desired, a floor layer may be created in the photopolymer layer after the substrate has been laminated to the liquid photopolymerizable resin layer. The floor layer may be created by exposing the photopolymer resin layer to actinic radiation through the substrate to create a cured and crosslinked thin floor layer over the entire area adjacent to the substrate. The preliminary exposure to actinic radiation and the creation of the floor layer may take place at substantially the same time.

Once the initial exposure step is complete, uncured photopolymer may be reclaimed from the surface of the printing element. Various methods may be used to reclaim the uncured liquid photopolymer from the relief layer. For example, the uncured photopolymer can be washed away with a suitable solvent, can be blown away using an air knife, or can be blotted or squeegeed away. A combination of two or more of the above-mentioned methods can be used. Preferably, the uncured photopolymer is reclaimed by using an air knife or a squeegee to remove the uncured photopolymer from the relief image printing element.

Thereafter, the relief image printing element is processed to remove any remaining uncured liquid photopolymer. The specific processing solution used will depend upon the specific composition of the photopolymer resin used, and would generally be well known to those skilled in the art. Generally, an aqueous alkaline solution is used. In addition, it may also be desirable to employ a small amount of detergent or surface active agent in the processing solution solution.

Following processing, the photopolymer layer is preferably "post-exposed" to actinic radiation, i.e., subjected to another dosage of actinic radiation. In this step, the islands of photopolymer are exposed to actinic radiation to fully cure the islands of photopolymer. Subjecting the plate to a second actinic radiation exposure step provides a more complete cure for the photopolymer layer of the invention, and thus a more durable relief image.

Thereafter, the islands of cured photopolymer are laser engraved to create the desired relief image in the islands of cured photopolymer by exposure to laser beam of sufficient intensity. The laser used for engraving is preferably an IR or near-IR laser. The layer is preferably vaporized or decomposed thermally or by oxidation without melting beforehand, so that its decomposition products are removed from the layer in the form of hot gases, vapors, fumes or small particles.

The control unit for the laser engraver is supplied with input data through artwork which is scanned as the photopolymer plate is engraved, or alternately, supplied with a digitized representation of the engraving directly from a separate computer system wherein the artwork is provided utilizing computer aided design (CAD) software, digitization of photographic or drafted artwork, or a combination thereof.

Optionally, but preferably, following the engraving step, the relief image printing element is cleaned to remove any debris remaining on the surface from the laser engraving step. This cleaning step typically comprises immersing the engraved plate in a solution to remove the tackiness from the residue, thereby providing sharp edges at the perimeter of the ablated areas, as the particulates are easily removed by brushing when they are no longer self adhering. The engraved plate may then be dried at a predetermined temperature for a time period sufficient to drive off any absorbed solvent.

Finally, the relief image printing element may also optionally, but preferably, be subjected to a detacking step either before the printing element is engraved or after the printing plate has been engraved (and preferably cleaned of any debris) to remove surface tack from the engraved plate and also to harden the surface. There are typically two ways in which such surface tack can be removed and the surface hardened. One method is exposure of the front surface of the engraved printing plate to high energy ultraviolet light for a predetermined period of time. The other method is a chemical finishing method wherein the engraved plate is immersed in a halogen solution, a solution containing chlorine, bromine or iodine. The finished plate is then ready for mounting on a printing press.

Thus, it can be seen that by preliminarily exposing a liquid photopolymer printing element to actinic radiation to create islands of solid photopolymer in areas where it is desirable to laser engrave the printing element, considerable time can be saved in the subsequent laser engraving of the printing element. Furthermore, a much higher percentage of uncured photopolymer can be reclaimed in the process for reuse.

While the invention has been described above with reference to specific embodiments thereof, it is apparent that many changes, modifications, and variations can be made without departing from the inventive concept disclosed here. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A method of making a relief image printing element from a liquid photopolymer composition, the method comprising the steps of, in order:
   a) casting a liquid photopolymer layer onto a cover sheet and at least substantially simultaneously placing a backing sheet onto the liquid photopolymer layer;
   b) preliminarily exposing the liquid photopolymer layer to actinic radiation to create at least one island of solid photopolymer in the liquid photopolymer layer where it is desirable to laser engrave a relief image;
   c) recovering and reclaiming uncured liquid photopolymer from the relief image printing element for reuse;
   d) processing the at least one island of solid photopolymer to remove residual traces of uncured liquid photopolymer remaining on the relief image printing element after step c);
   e) exposing the at least one island of solid photopolymer to actinic radiation to fully cure the at least one island of solid photopolymer; and
   f) laser engraving the at least one island of solid photopolymer to produce the relief image therein.

2. The method according to claim 1, wherein the laser for engraving the at least one island of cured photopolymer operates in the infrared or near infrared range.

3. The method according to claim 1, wherein the step of preliminarily exposing the liquid photopolymer layer to actinic radiation to create at least one island of photopolymer includes back exposing the liquid photopolymer layer to create a floor layer in the relief image printing element.

4. The method according to claim 1, wherein the step of recovering and reclaiming uncured liquid photopolymer comprises using an air knife or a squeegee to remove the uncured liquid photopolymer from the relief image printing element.

5. The method according to claim 1, wherein the processing step comprises dry blotting, or using soap and a water wash, to remove the uncured photopolymer from the printing element.

6. The method according to claim 1, further comprising the step of detacking the photopolymer resin layer prior to the laser engraving step.

7. The method according to claim 1, further comprising the step of washing debris off of the engraved surface of the relief image printing element after step f).

8. The method according to claim 1, comprising the step of detacking the photopolymer resin layer after the laser engraving step.

9. The method according to claim 1, wherein the backing sheet and the cover sheet are transparent.

10. The method according to claim 1, wherein the step of preliminarily exposing the liquid photopolymer layer to actinic radiation creates multiple islands of solid photopolymer in the liquid photopolymer layer where it is desirable to laser engrave the relief image.

11. The method according to claim 3, wherein the step of preliminarily exposing the liquid photopolymer layer to actinic radiation to create at least one island of photopolymer and the step of back exposing the liquid photopolymer layer to create the floor layer take place at least substantially simultaneously.

* * * * *